(12) United States Patent
Ariki

(10) Patent No.: US 7,881,122 B2
(45) Date of Patent: Feb. 1, 2011

(54) DISCHARGE CIRCUIT

(75) Inventor: Takuya Ariki, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 217 days.

(21) Appl. No.: 12/334,573

(22) Filed: Dec. 15, 2008

(65) Prior Publication Data

US 2009/0179694 A1    Jul. 16, 2009

(30) Foreign Application Priority Data

Dec. 20, 2007 (JP) ............................. 2007-328963
Aug. 5, 2008 (KR) ............................. 2008-76658

(51) Int. Cl.
*G11C 11/34* (2006.01)
*G11C 16/06* (2006.01)

(52) U.S. Cl. ........................... 365/185.25; 365/185.22

(58) Field of Classification Search ............ 365/185.25, 365/185.22, 185.29
See application file for complete search history.

(56) References Cited

U.S. PATENT DOCUMENTS 5,719,807 A * 2/1998 Sali et al. ............... 365/185.25
6,373,749 B1   4/2002 Atsumi et al.
6,667,910 B2 * 12/2003 Abedifard et al. ...... 365/185.29
7,248,521 B2 * 7/2007 Patel et al. .................. 365/204
7,542,351 B2 * 6/2009 Choy et al. ............ 365/185.25

FOREIGN PATENT DOCUMENTS

JP     2005-310301     11/2005

* cited by examiner

*Primary Examiner*—Anh Phung
(74) *Attorney, Agent, or Firm*—Volentine & Whitt, PLLC

(57) ABSTRACT

Provided is a discharge circuit. The discharge circuit for discharging two positive and negative high voltages after an erase operation of a non-volatile memory includes: a negative high voltage side discharge unit flowing constant current from a supply voltage to a negative high voltage node of the non-volatile memory to discharge the negative high voltage node; and a positive high voltage side discharge unit flowing constant current from a positive high voltage node of the non-volatile memory to a ground voltage to discharge the positive high voltage node, the positive high voltage side discharge unit simultaneously operating with the negative high voltage side discharge unit, wherein values of the constant currents flowing from the positive and negative high voltage side discharge units are approximately equal.

11 Claims, 10 Drawing Sheets

DISCHARGE CIRCUIT

CROSS-REFERENCE TO RELATED APPLICATIONS

This U.S. non-provisional patent application claims priority under 35 U.S.C. §119 of Japanese Patent Application No. 2007-328963 filed on Dec. 20, 2007 and Korea Patent Application No. 2008-76658 filed on Aug. 5, 2008, the entire contents of which are hereby incorporated by reference.

BACKGROUND OF THE INVENTION

The present invention disclosed herein relates to a discharge circuit for discharging two positive and negative high voltages after an erase operation of a non-volatile memory.

FIG. 8 is a cross-sectional structure of a flash memory cell and illustrates an electric potential state during an erase operation. In FIG. 8, coupling parasitic capacitance Cp, which causes various limitations during resetting of a voltage after an erase operation of a flash memory cell, also is illustrated. In the flash memory cell of FIG. 8, an N-well 12 and a P-well 13 are formed in a P-type substrate 11, and a source/drain region 14 of the memory cell is formed in the P-well 13. Moreover, a floating gate 15 and a control gate 16 are stacked on the P-well 13 between the source region 14 and the drain region 14. The control gate 16 is connected to a word line WL. Coupling parasitic capacitance Cp is formed between the word line WL and the P-well 13.

In a typical NOR flash memory having the above flash memory cell, a negative high voltage (e.g., −9 V, hereinafter, referred to as Vneg) supplied from a charge pump is applied to the word line WL and a positive high voltage (e.g., 9 V, hereinafter, referred to as Vpm) supplied from another charge pump is applied to the wells 12 and 13, during a data erasing operation. Therefore, electrons in the floating gate 15 transfers to the wells 12 and 13 through an FN tunneling phenomenon in order to erase stored data. Although physical one bit cell is illustrated in FIG. 8, the erasing of stored data is completed by a large block unit such that a voltage Vneg is simultaneously applied to a plurality of word lines WL. Accordingly, an overall coupling parasitic capacitance Cp between the word lines WL and the P-well is increased. This coupling parasitic capacitance Cp causes coupling noise during the resetting of a voltage after an erase operation.

A detailed description of the above limitation is disclosed in U.S. Pat. No. 6,373,749 and this will be described in brief. FIGS. 9 through 11 are timing charts illustrating the above limitations. FIG. 9 is a timing chart when voltages Vneg and Vpm are not simultaneously reset and the voltage Vneg is reset first. Japanese Patent Publication No. 2005-310301 uses the above timing chart. In this timing chart, since about −9 V is discharged at about 0 V, voltage amplitude changes significantly and its noise increases a voltage Vpm having a floating state through the coupling parasitic capacitance Cp. Accordingly, since the voltage Vpm, which originally has a high voltage, is increased more by the noise, it may exceed a withstanding voltage of a transistor in a decoder circuit that supplies the voltage Vpm. This may cause physical damage in the transistor. As a result, defective chip can be produced.

FIG. 10 is a view when a voltage Vpm is reset first. Due to the same reason, a voltage Vneg exceeds a withstanding voltage. Therefore, same risk may occur as before.

FIG. 11 is a view when voltages Vpm and Vneg are reset simultaneously. In this case, when considering reset capability of voltages Vpm and Vneg, noise may differently occur. In FIG. 11, transistor's capability for resetting the voltage Vpm is higher than that of the voltage Vneg. The voltage Vpm is reset fast and the voltage Vneg is reset slowly. Thus, noise from the voltage Vpm becomes greater than reset such that the Vneg may exceed a withstanding voltage.

SUMMARY OF THE INVENTION

The present invention provides a discharge circuit capable of preventing coupling noise when two high voltages are reset after an erase operation of a non-volatile memory.

Embodiments of the present invention provide discharge circuits for discharging two positive and negative high voltages after an erase operation of a non-volatile memory include: a negative high voltage side discharge unit flowing constant current from a supply voltage to a negative high voltage node of the non-volatile memory to discharge the negative high voltage node; and a positive high voltage side discharge unit flowing constant current from a positive high voltage node of the non-volatile memory to a ground voltage to discharge the positive high voltage node, the positive high voltage side discharge unit simultaneously operating with the negative high voltage side discharge unit, wherein values of the constant currents flowing from the positive and negative high voltage side discharge units are approximately equal.

In some embodiments, the discharge circuits further include: a negative high voltage side potential detector detecting that the negative high voltage node is discharged into a ground voltage; a ground voltage fixing unit connecting the negative high voltage node to the ground voltage when it is detected by the negative high voltage side potential detector that the negative high voltage node is discharged into the ground voltage; a positive high voltage side potential detector detecting that the positive high voltage node is discharged into a supply voltage; and a supply voltage fixing unit connecting the positive high voltage node to the supply voltage when the positive high voltage side potential detector detects that the positive high voltage node is discharged into the supply voltage.

In other embodiments, by a gate ground type amp including a PMOS transistor and an NMOS transistor connected in series, the negative high voltage side discharge unit serves as the negative high voltage side potential detector, the PMOS transistor flowing constant current, the NMOS transistor having a gate to which a reference voltage is supplied; and by a gate ground type amp including an NMOS transistor and a PMOS transistor connected in series, the positive high voltage side discharge unit serves as the positive high voltage side potential detector, the NMOS transistor flowing constant current, the PMOS transistor having a gate to which a reference voltage is supplied.

In still other embodiments, the negative high voltage side discharge unit and the positive high voltage side discharge unit simultaneously operate by receiving a discharge start signal when two positive and negative high voltages for the negative and positive high voltage nodes are reset after the erase operation of the non-volatile memory.

In even other embodiments, the positive and negative high voltage side discharge units reflect constant current generated in a constant current generator and drains reflected constant current that is M times of the constant current flowing in the constant current generator.

In other embodiments of the present invention, non-volatile memory devices include the above discharge circuit.

In still other embodiments of the present invention, memory systems include: the above non-volatile memory device; and a memory controller controlling the non-volatile memory device.

In even other embodiments of the present invention, computing systems include: a host; the above non-volatile memory device; and a memory controller controlling the non-volatile memory device in response to a request of the host.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Hereinafter, exemplary embodiments of a discharge circuit according to the present invention will be described in detail with reference to the accompanying drawings.

Figure 1:
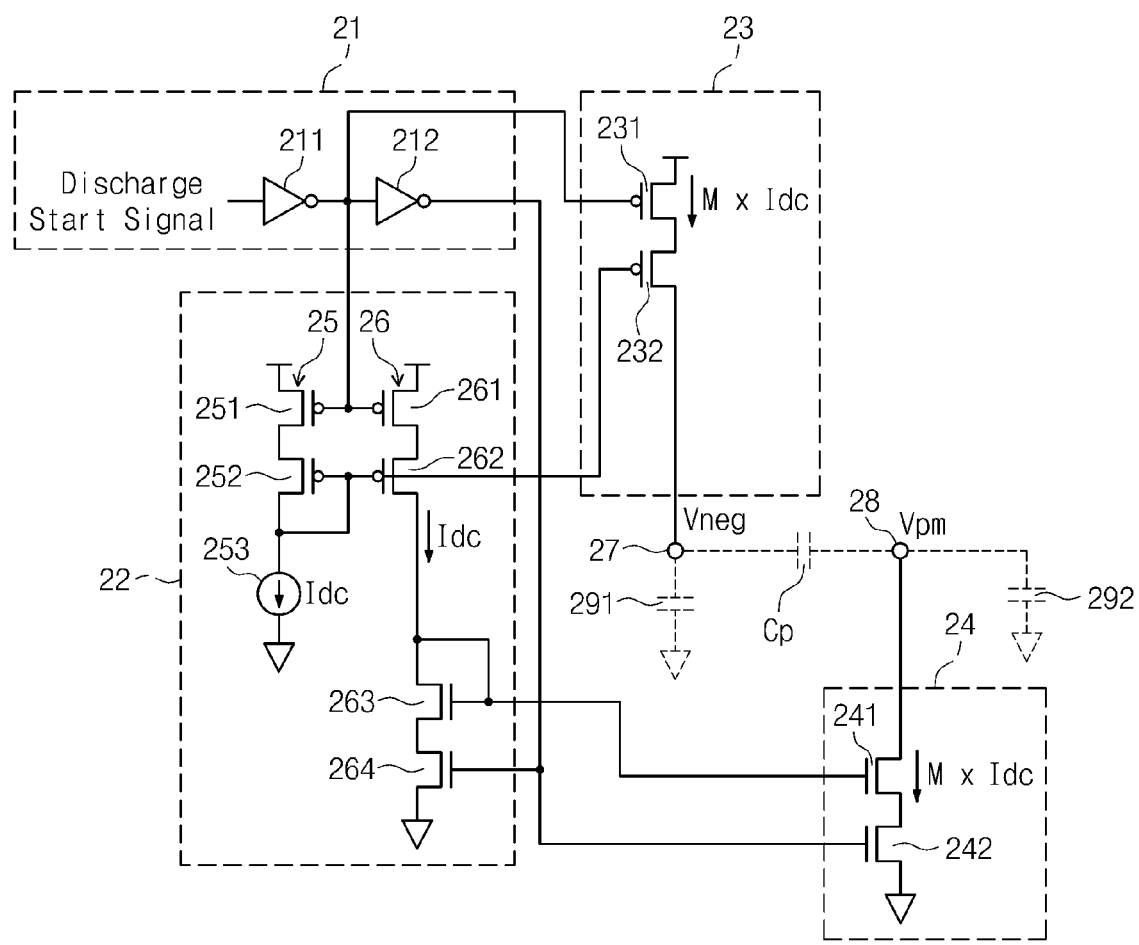
FIG. 1 is a circuit diagram illustrating a discharge circuit according to a first embodiment of the present invention.

FIG. 1 is a circuit diagram illustrating a discharge circuit according to a first embodiment of the present invention. This discharge circuit includes a controller 21, a constant current generator 22, a negative high voltage side discharge unit 23, and a positive high voltage side discharge unit 24.

The constant current generator 22 includes two series circuits 25 and 26 connected between a supply voltage and a ground voltage. The first series circuit 25 includes two PMOS transistors 251 and 252 and a constant current source 253 to generate a constant current Idc. The second series circuit 26 includes two PMOS transistors 261 and 262 and two NMOS transistors 263 and 264. The second series circuit 26 generates the same constant current Idc as the first series circuit 25 because the PMOS transistors 262 and the PMOS transistor 252 of the first series circuit 25 constitute tendency mirror. Additionally, the two series circuit 25 and 26 can be operated when the PMOS transistors 251 and 261 are turned on by an output of an inverter 211 of the controller 21 and the NMOS 264 is turned on by an output of an inverter 212 of the controller 21 at the same time.

Figure 8:
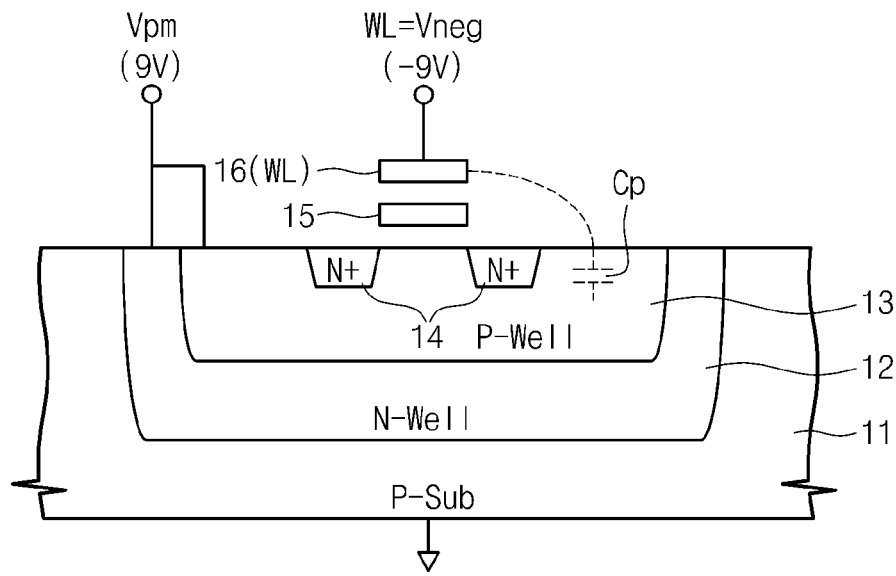
FIG. 8 is a cross-sectional structure of a flash memory cell and illustrates an electric potential state during an erase operation.
Figure 9:
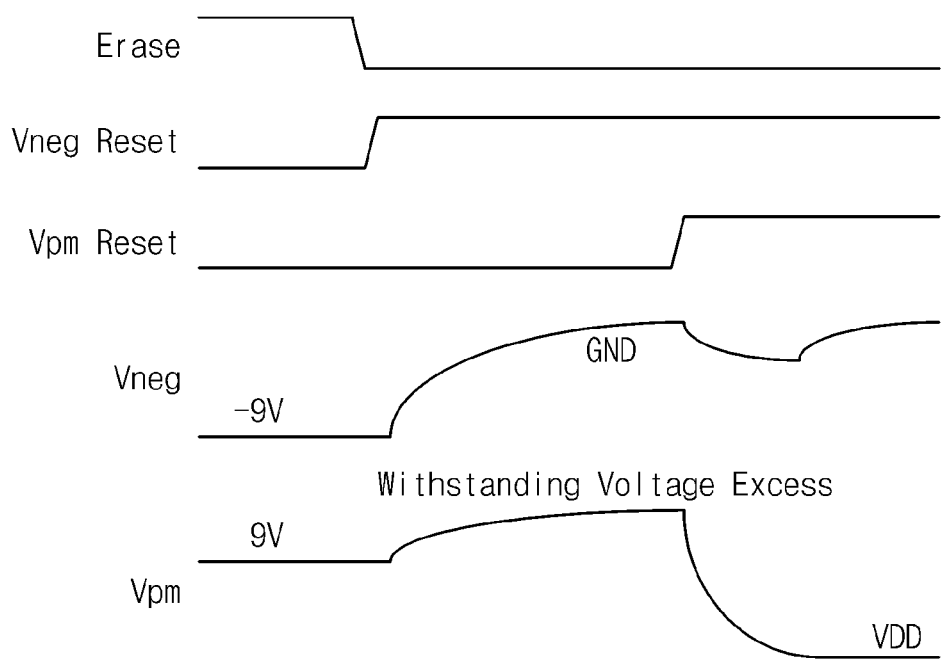
FIG. 9 is a timing chart for illustrating typical limitations.
Figure 10:
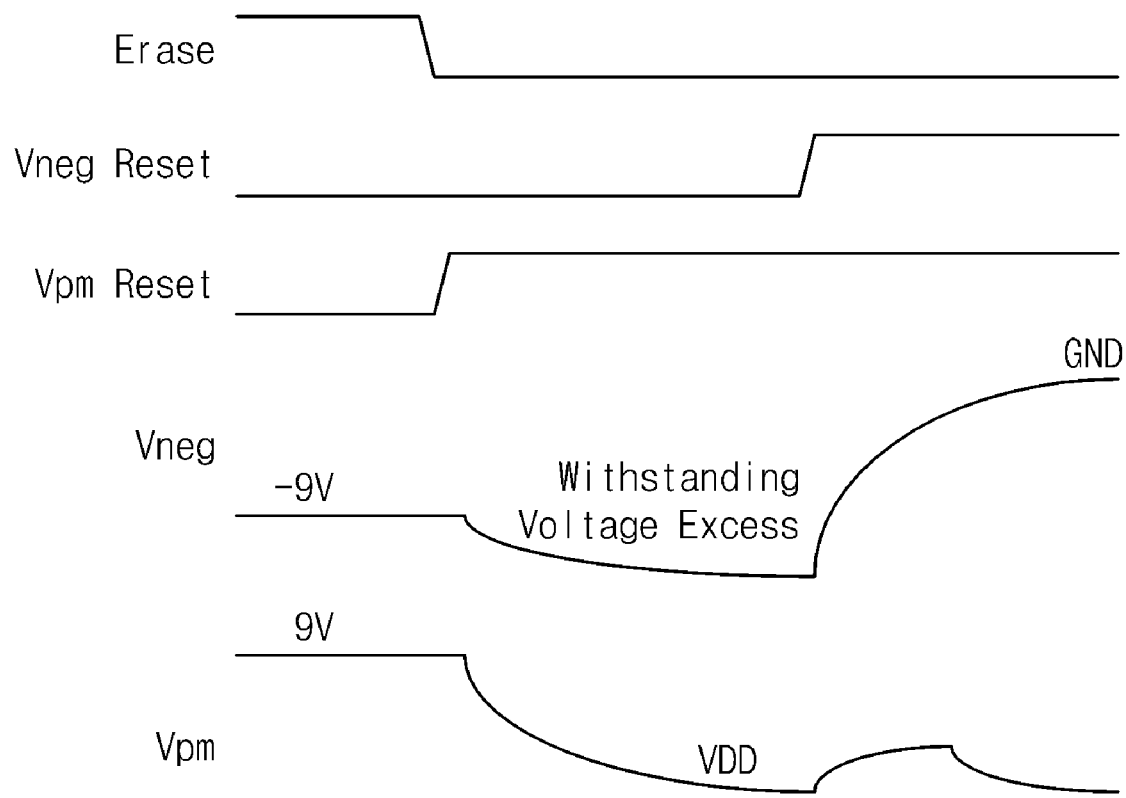
FIG. 10 is a timing chart for illustrating typical limitations.
Figure 11:
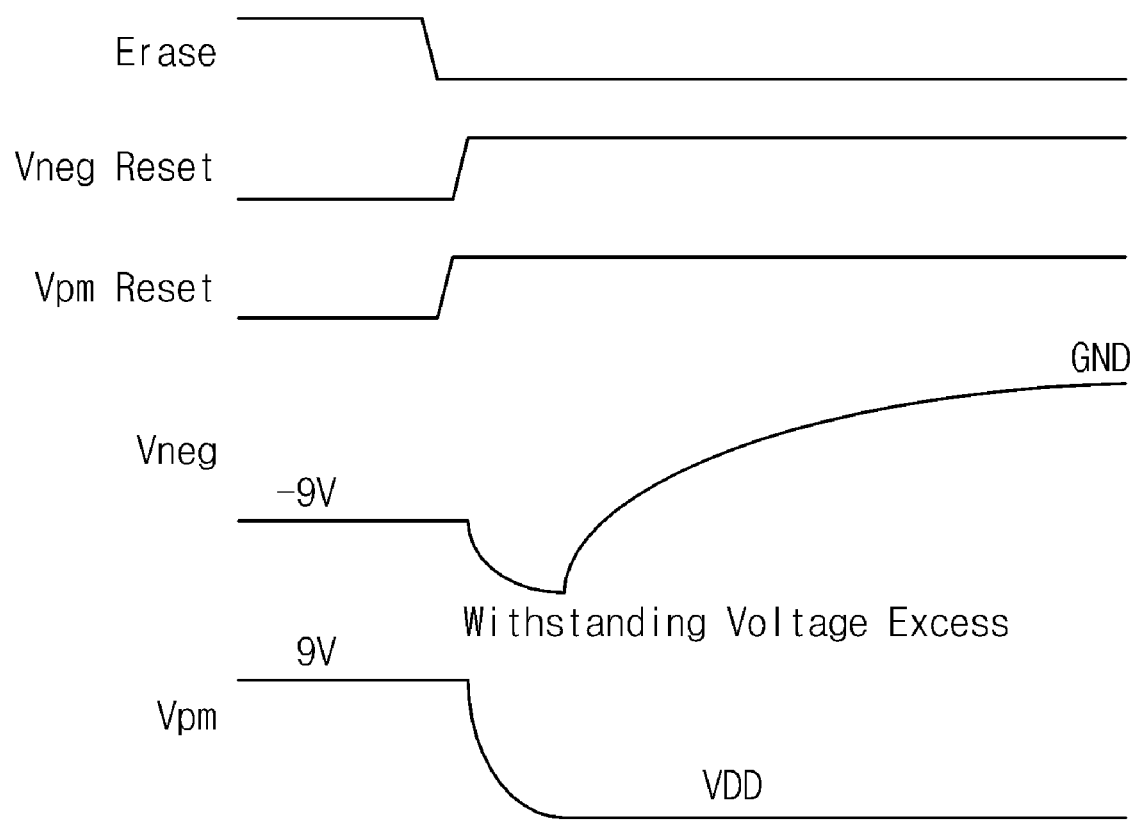
FIG. 11 is a timing chart for illustrating typical limitations.

The negative high voltage side discharge unit 23 includes a series circuit of two PMOS transistors 231 and 232, and is connected between a supply voltage (e.g., about 3 V) and a negative high voltage node 27 during an erase operation of a flash memory cell, that is, between the word lines WL of a flash memory cell of FIG. 8. The negative high voltage side discharge unit 23 can be operated when the PMOS transistor 231 is turned on by an output of the inverter 211 in the controller 21. In the negative high voltage side discharge unit 23, because the PMOS transistors 262 of the second series circuit 26 and the PMOS transistor 252 of the first series circuit 25 constitute tendency mirror, a constant current reflecting a constant current of the constant current generator 22 flows. However, since the sizes (i.e., the channel widths) of the PMOS transistors 231 and 232 are greater than that of a transistor in the constant current generator 22, a constant current (M×Idc) flows with a mirror ratio (i.e., an M times of Idc).

The positive high voltage side discharge unit 24 includes a series circuit of two NMOS transistors 241 and 242 and is connected to the positive high voltage node 28 during an erase operation of a flash memory cell, that is, between a P-well 13 of the flash memory cell of FIG. 8 and a ground voltage (e.g., about 0 V). The positive high voltage side discharge unit 24 can be operated when the NMOS transistor 232 is turned on by an output of the inverter 212 of the controller 21. In the positive high voltage side discharge unit 24, because the NMOS transistors 241 and the NMOS transistor 263 of the constant current generator 22 constitute tendency miller, a constant current reflecting a constant current of the constant current generator 22 flows, but since the sizes (i.e., the channel widths) of the NMOS transistors 241 and 242 are greater than that of a transistor of the constant current generator 22, a constant current (M×Idc) flows with a mirror ratio (i.e., an M times of Idc).

Moreover, since a negative high voltage node 27 is the word line WL of the flash memory cell and a positive high voltage node 28 is the P-well 13 of the flash memory cell of FIG. 8, the coupling parasitic capacitance Cp of FIG. 8 exists between the negative high voltage node 27 and the positive high voltage node 28. Furthermore, the negative high voltage node 27 and the positive high voltage node 28 are connected to ground parasite capacitors 291 and 292, respectively. Furthermore, during an erase operation of the flash memory cell, a negative high voltage (e.g., −9 V, hereinafter, referred to as Vneg) is applied to the negative high voltage node 27 and a positive high voltage (e.g., 9 V, hereinafter, referred to as Vpm) is applied to the positive high voltage node 28.

Figure 2:
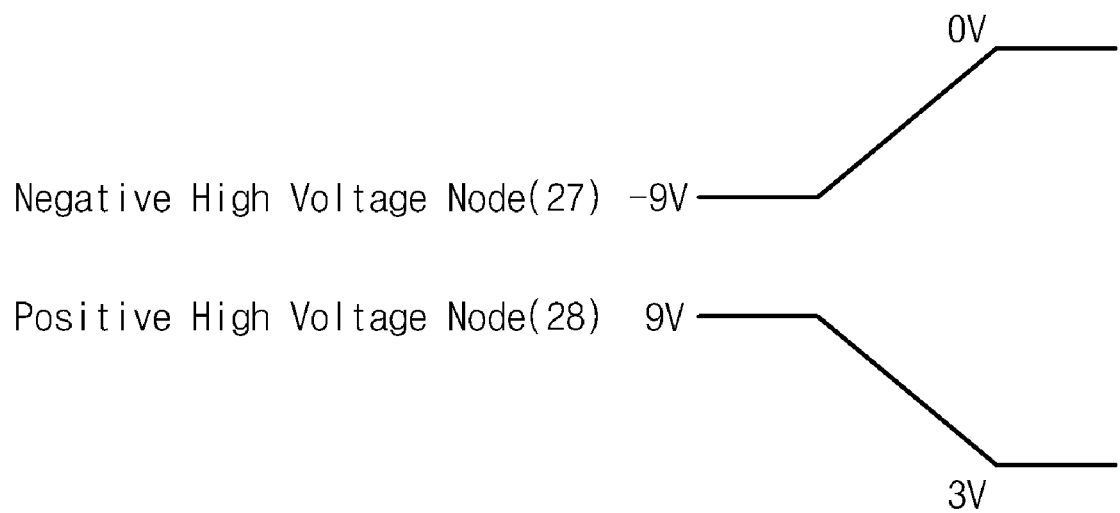
FIG. 2 is a waveform diagram illustrating discharge characteristic of a discharge circuit of FIG. 1.

The discharge circuit having the above structure operates through an output of a discharge start signal when voltages Vneg and Vpm applied to the negative high voltage node 27 and the positive high voltage node 28 are reset after an erase operation of the flash memory cell. Additionally, once the discharge circuit operates, a constant current of M×Idc flows from the supply voltage (e.g., about 3 V) to the negative high voltage node 27 (e.g., about −9 V) through the negative high voltage side discharge unit 23. Simultaneously, through the positive high voltage side discharge unit 24, a constant current of M×Idc flows from the positive high voltage node 28 (e.g., about 8 V) to the ground voltage (e.g., about 0 V). As a result of flowing of the constant current, the negative high voltage node 27, as illustrated in FIG. 2, is linearly discharged from about −9V to about 0 V (i.e., a ground voltage), and the positive high voltage node 28 is linearly discharged from about 9 V to about 3V (i.e., a supply voltage) at the same time. That is, the two high voltage nodes 27 and 28 are symmetrically discharged toward a reverse voltage direction at the same time, such that an potential change at one side influences the coupling parasitic capacitance Cp to prevent coupling noise that affects one side. Therefore, a withstanding voltage, which damages a transistor of a decoder circuit, can be prevented from being exceeded. Moreover, by adjusting a constant current miller ratio M of the negative and positive high voltage side discharge units 23 and 24 with respect to the constant current Idc of the constant current generator 22, discharge time can be controlled.

Figure 3:
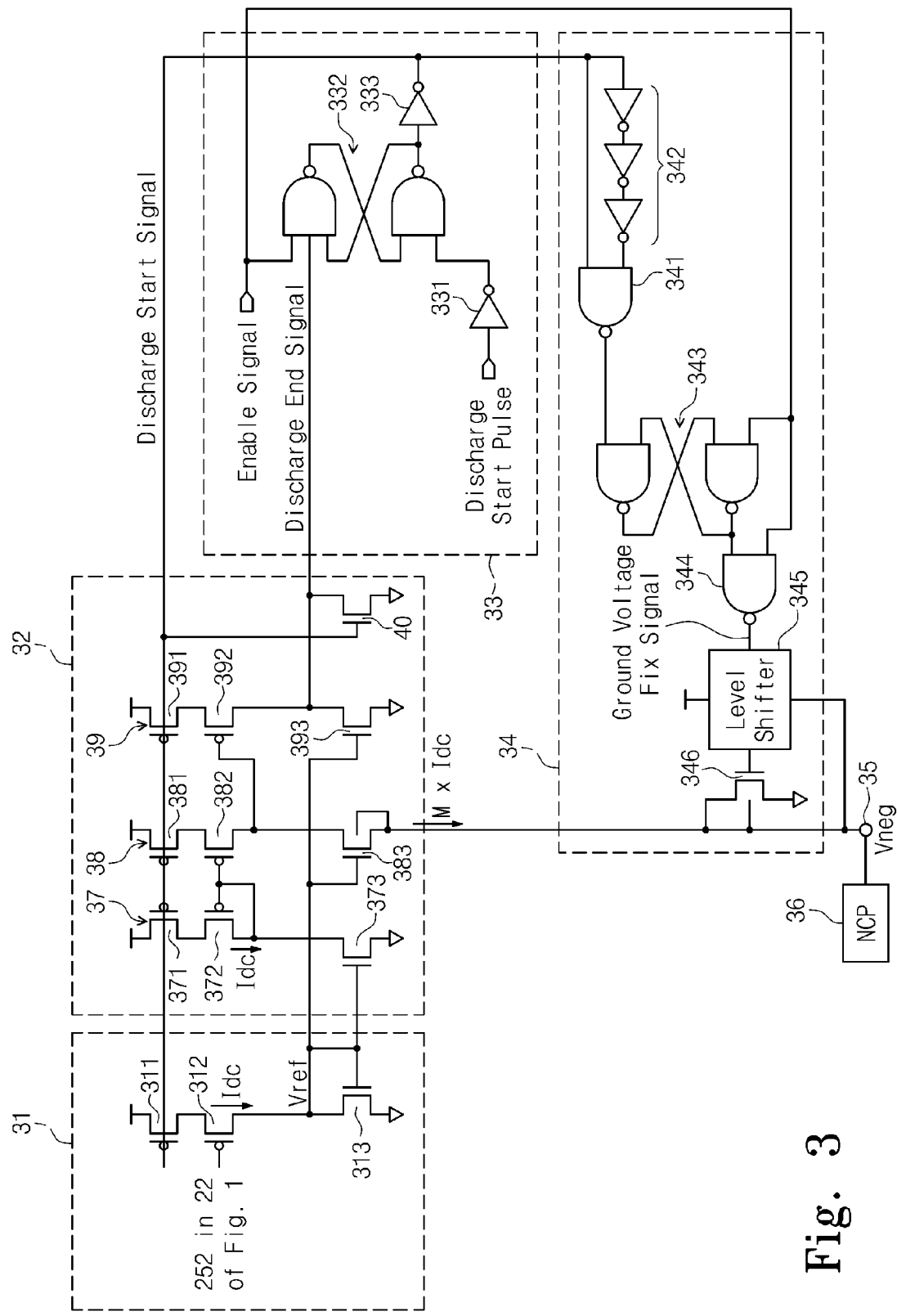
FIG. 3 illustrates a discharge circuit for a negative high voltage node according to a second embodiment of the present invention.
Figure 4:
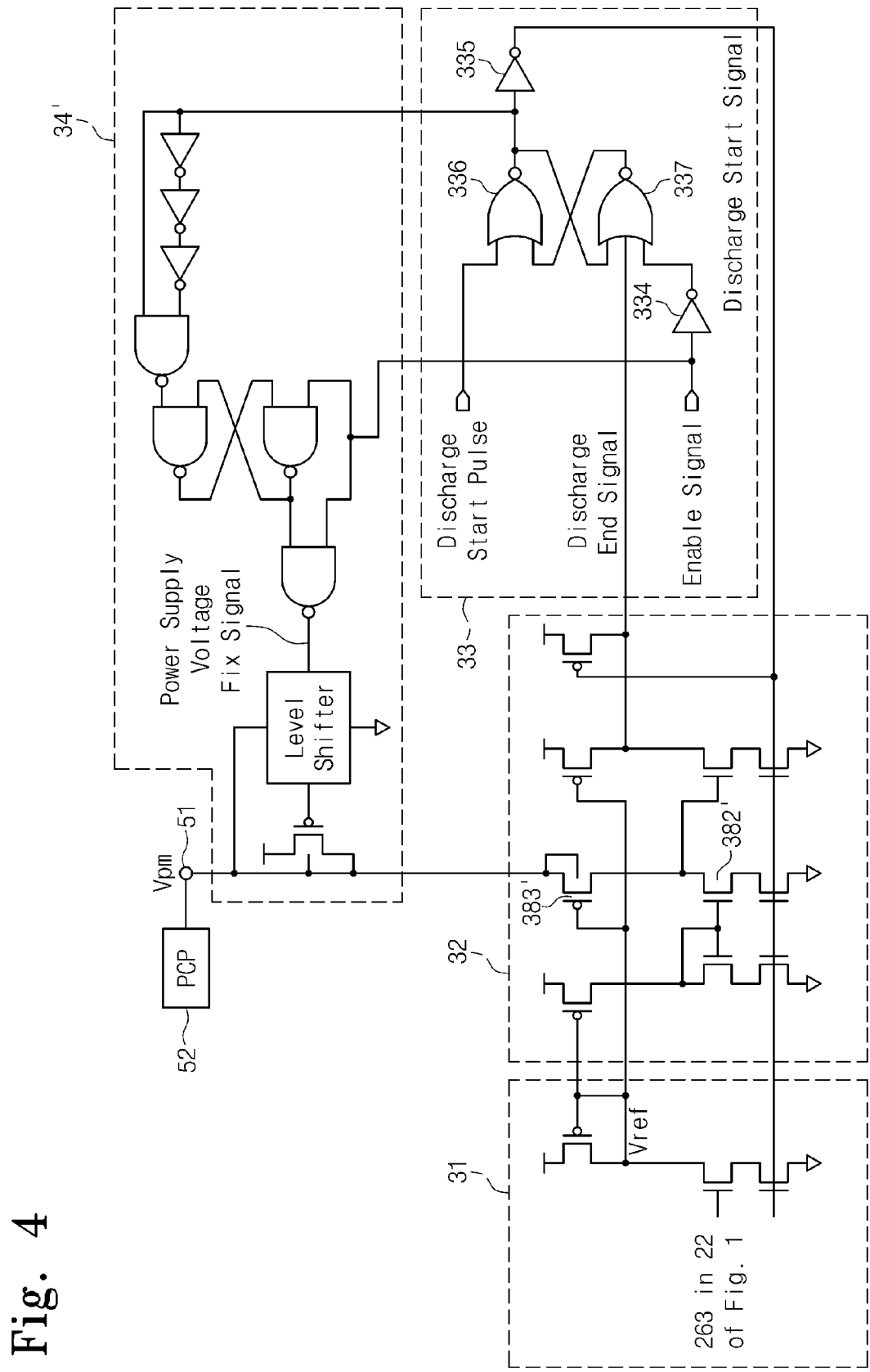
FIG. 4 illustrates a discharge circuit for a positive high voltage node according to a second embodiment of the present invention.

Substantially, besides the coupling parasitic capacitance of the negative and positive high voltage nodes 27 and 28, there are ground parasitic capacitances 291 and 292. Thus, the consumed time for being discharged into a predetermined voltage (about −9 V→about 0 V and about 9 V→about 3 V) may vary in the negative and positive high voltage nodes 27 and 28. Accordingly, coupling noise can be prevented only with the structure of FIG. 1, but there are still limitations after reaching the predetermined voltage. To resolve those limitations, a discharge circuit having a discharge self-stopping function is illustrated as a second embodiment in FIGS. 3 and 4. FIG. 3 illustrates a discharge circuit for a negative high voltage node. FIG. 4 illustrates a discharge circuit for a positive high voltage node. Since complementary circuits are used in FIGS. 3 and 4, their operating principles are the same. Therefore, through the discharge circuit for the negative high voltage node of FIG. 3, the second embodiment will be described.

The discharge circuit of FIG. 3 includes a bias unit 31, a discharge and potential detector 32, a controller 33, and a ground voltage fixing unit 34.

The controller 33 includes an inverter 331, a flip-flop 332, and inverter 333. The inverter 331 receives a discharge start pulse. The flip-flop 332 receives an output of the inverter 331, a discharge end signal, and an enable signal. The inverter 333 is connected to an output of the flip-flop 332 and outputs a discharge start signal.

The ground voltage fixing unit 34 includes a NAND circuit 341, a flip-flop 343, a NAND circuit 344, a level shifter 345, and an NMOS transistor 346. The NAND circuit 341 includes one input terminal for directly receiving a discharge start signal and the other input terminal for receiving a discharge start signal through three invertors 342 connected in series. The flip-flop 343 receives an output of the NAND circuit 341 and the enable signal. The NAND circuit 344 receives an output of the flip-flop 343 and the enable signal. The level shifter 345 level-shifts a ground voltage fixing signal of an output from the NAND circuit 344. The NMOS transistor 346 is controlled by an output of the level shifter 345 and is connected to between a negative high voltage node 35 and a ground voltage. The negative high voltage node 35 is connected to a negative charge pump circuit 36 for supplying a voltage Vneg to the negative high voltage node 35.

The bias unit 31 includes a series circuit of two PMOS transistors 311 and 312 and one NMOS transistor 313, and is connected between a supply voltage and a ground voltage. The PMOS transistor 313 is turned on by a discharge start signal to allow the bias unit 31 to operate. The PMOS transistor 312 and the PMOS transistor 252 of the constant current generator 22 of FIG. 1 constitute a tendency mirror, thereby generating a constant current Idc in the bias unit 31 in order to generate a reference voltage Vref in a drain of the NMOS transistor 313.

The discharge and potential detector 32 includes three series circuits 37, 38, and 39, and one NMOS transistor 40.

The first series circuit 37 includes two PMOS transistors 371 and 372 and one NMOS transistor 373, and is connected between the supply voltage and the ground voltage. The PMOS transistor 371 is turned on by the discharge start signal to allow the first series circuit 37 to operate. The NMOS transistor 373 and the NMOS transistor 313 of the bias unit 31 constitute a tendency mirror, thereby generating the same constant current Idc in the first series circuit 37 as the bias unit 31.

The second series circuit 38 includes two PMOS transistors 381 and 382 and one NMOS transistor 383, and is connected between the supply voltage and the negative high voltage node 35. The PMOS transistor 381 is turned on by the discharge start signal to allow the second series circuit 38 to operate. The PMOS transistor 382 and the PMOS transistor 372 of the first series circuit 37 constitute a tendency mirror, such that a constant current in the second series circuit 38 is generated by reflecting the constant current of the first series circuit 37. However, by enlarging the sizes (i.e., the channel widths) of the MOS transistors 381, 382, and 383 of the second series circuit 38, a constant current M×Idc flows with a mirror ratio (i.e., M times of Idc). By supplying the reference voltage Vref, which is generated in the drain of the NMOS transistor 313 in the bias unit 31, to a gate of the NMOS transistor 383, the NMOS transistor 383 and the PMOS transistor 382 constitute a gate ground type amp. This amp detects a situation where the negative high voltage node 35 is discharged to the ground voltage during discharging of the negative high voltage node 35 based on a potential change in a drain of the NMOS transistor 383. Accordingly, a discharge unit for the negative high voltage node 35 also functions as a potential detector for detecting of being discharged into the ground voltage.

The third series circuit 39 includes two PMOS transistors 391 and 392 and one NMOS transistor 393 and is connected between the supply voltage and the ground voltage. The PMOS transistor 391 is turned on by the discharge start signal to allow the third series circuit 39 to operate. The PMOS transistor 392 and the NMOS transistor 393 constitute a cascade connected source ground type amp and amplifies a discharge detect signal in the drain of the NMOS transistor 383 (i.e., the preceding terminal) to output it as a discharge end signal.

The NMOS transistor 40 is connected between the line of the discharge end signal and the ground voltage, and is controlled by the discharge start signal.

Although the discharge circuit for the negative high voltage node of FIG. 3 is configured as above, according to the discharge circuit for the positive high voltage node of FIG. 4, polarity of the MOS transistor and an applying state of a voltage are revered. Other components of FIG. 4 are approximately equal to those of FIG. 3. An overlapping description related to FIGS. 3 and 4 will be omitted and like reference numbers refer to like elements. However, a controller 33 of FIG. 4 includes two inverters 334 and 335 and two NOR circuits 336 and 337. Additionally, a discharge node is a positive high voltage node 51 and a voltage Vpm from a positive charge pump circuit 52 is applied to the positive voltage node 51. Moreover, a discharge and potential detector 32 detects that the positive high voltage node 51 is discharged into a supply voltage, and a fixing unit is a supply voltage fixing unit 34' for fixing the positive high voltage node 51 with a supply voltage through a supply voltage fix signal. Moreover, the discharge and potential detector 32 constitutes a gate group type amp where an NMOS transistor 382' for draining a constant current and a PMOS transistor 383' having a gate to which a reference voltage is supplied are connected in series.

An operation of the above discharge circuit FIG. 3 will be described with reference to an operation order of FIG. 5.

Figure 5:
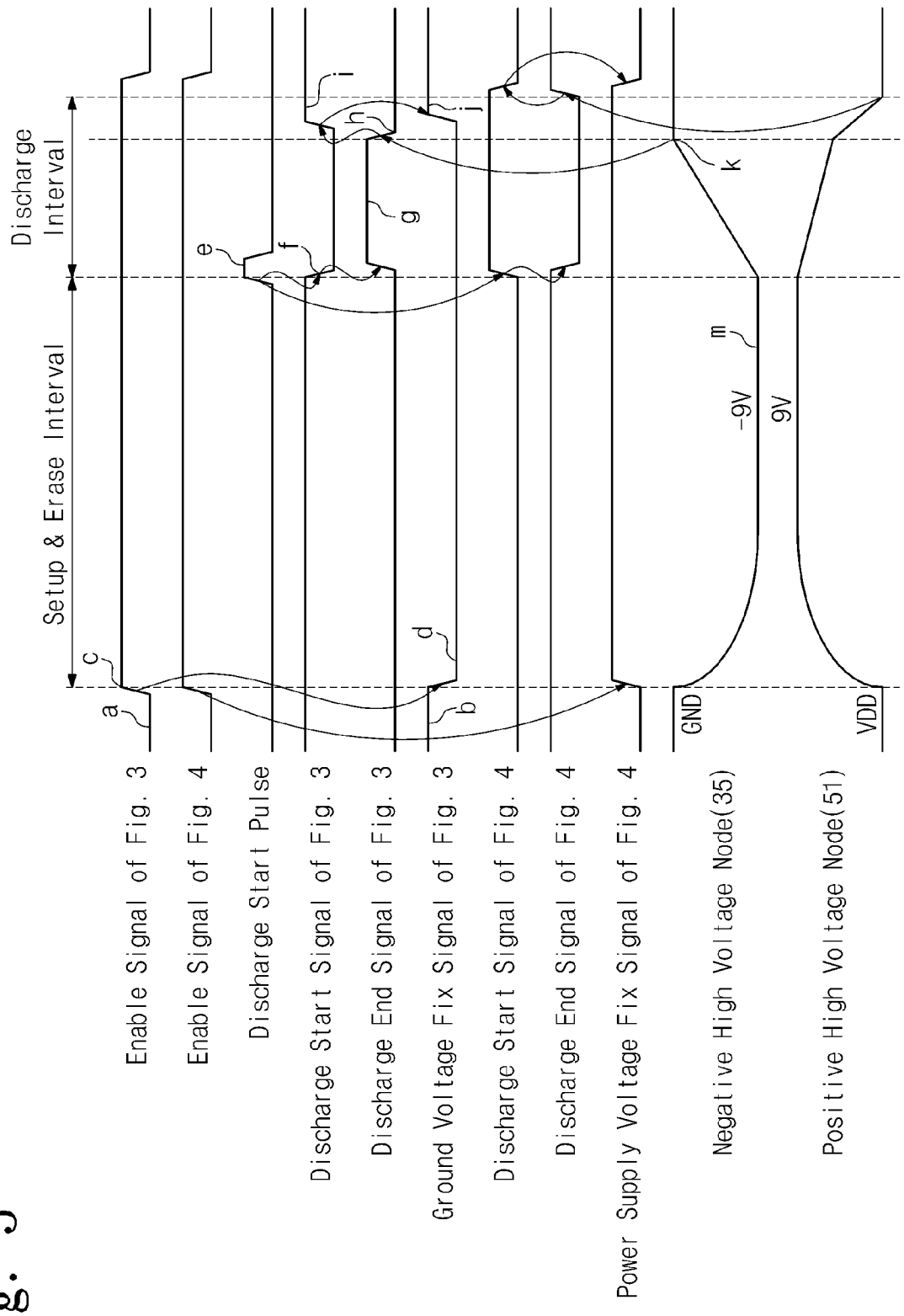
FIG. 5 is a timing chart illustrating an operation order according to a second embodiment of the present invention.

While it is on standby before an erasing operation, the negative high voltage node 35 is connected to the ground voltage through the NMOS transistor 346, an enable signal is fixed by L (i.e., a of FIG. 5), and a ground voltage fix signal is fixed by H (i.e., b of FIG. 5). As soon as an erasing operation starts, an enable signal becomes H (c of FIG. 5). Thus, the ground voltage fix signal becomes L (d of FIG. 5) and the negative high voltage node 35 is released from the ground voltage. Simultaneously, a voltage Vneg (about −9 V) is applied from the negative charge pump circuit 36 to the negative high voltage node 35 (m of FIG. 5).

Accordingly, although the erasing operation is in progress, once the erasing operation is completed and the voltage Vneg is reset, since a discharge start pulse (e of FIG. 5) of a short H pulse is generated simultaneously, the discharge start signal becomes H→L (f of FIG. 5) so that the bias unit 31 and the discharge and potential detector 32 can be operated. Therefore, discharging starts. That is, when the bias unit 31 generates a constant current Idc, the constant current Idc flows into the PMOS transistor 372 through the tendency mirror of the NMOS transistors 313 and 373. Furthermore, because of being connected to the PMOS transistor 382 with the mirror ratio M, the constant current M×Idc flows from the supply voltage to the negative high voltage node 35 such that the negative high voltage node 35 can be discharged.

Moreover, when the negative high voltage node 35 reaches a ground voltage (k of FIG. 5) through this discharging operation, the reaching of the ground voltage is detected through the gate ground type amp including the PMOS transistor 383 and the NMOS transistor 383. Thus, a detect signal is outputted as a discharge end signal (h of FIG. 5) through the cascade connected source ground type amp including the PMOS transistor 392 and the NMOS transistor 393.

Although this discharge end signal becomes H (g of FIG. 5) at a discharge start point, it becomes L (h of FIG. 5) by a level detector at a point where the negative high voltage node 35 reaches the ground voltage. This causes the discharge start signal to be H (i of FIG. 5) in order to stop operations of the bias unit 31 and the discharge and potential detector 32. Thus, constant current discharging of the negative high voltage node 35 stops and the discharge end signal line turns on the NMOS transistor 40 to be connected to a ground voltage at the same time. Furthermore, by using the ground voltage fix signal as H (of FIG. 5), the negative high voltage node 35 is connected to the ground voltage through the NMOS transistor 346.

In relation to discharging of the positive high voltage node 51 of FIG. 4, it is finally connected to a power source voltage, following the same order. In FIG. 5, at a point (k of FIG. 5) where the negative high voltage node 35 reaches the ground voltage GND, the positive high voltage node 51 does not reach the supply voltage VDD yet and still in a discharging state. However, at a point (k of FIG. 5) where the negative high voltage node 35 reaches the ground voltage GND, the negative high voltage node 35 is connected to the ground voltage GND through the NMOS transistor 346. Therefore, noise due to the continuous discharging of the positive high voltage is prevented from influencing the negative high voltage node 35. This is completely the same when the positive high voltage node 51 is discharged fast. According to this discharge order, coupling noise influence is prevented such that fast discharging becomes possible through adjustment of an amount of constant current. Additionally, through detecting discharge potential, it is possible to completely control potential after discharging.

Figure 6:
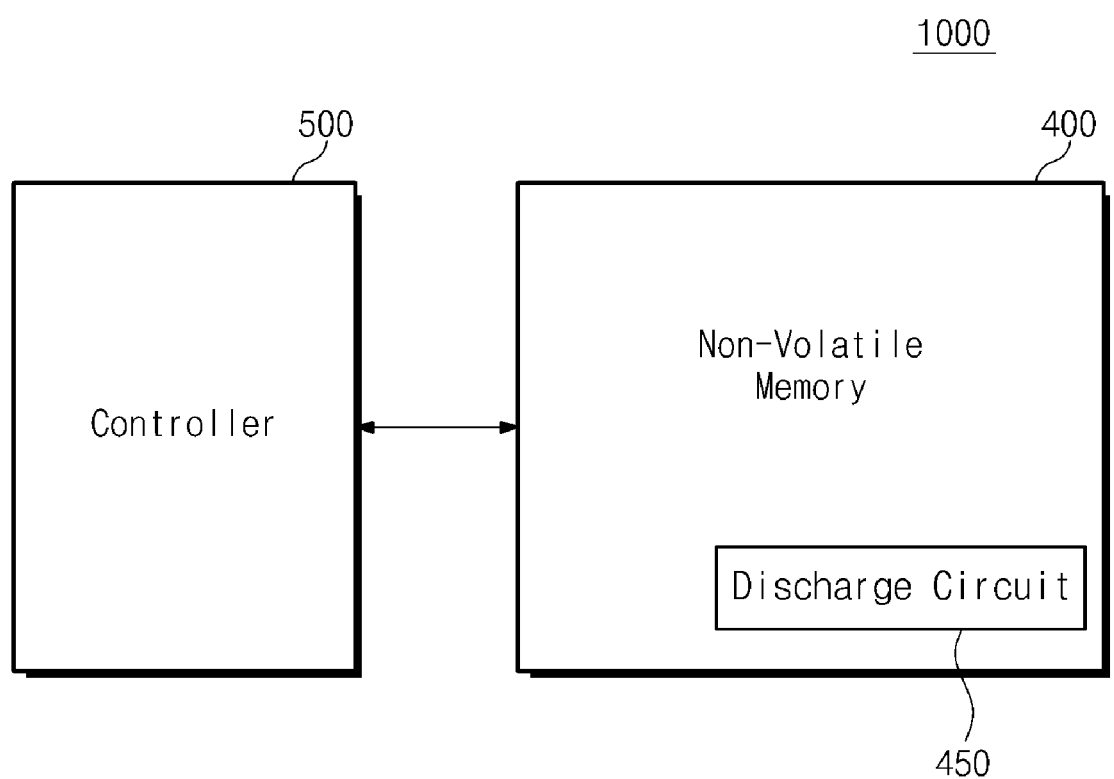
FIG. 6 is a block diagram illustrating a memory system including a non-volatile memory with a discharge circuit.

A non-volatile memory 400 of FIG. 6 includes a memory card and/or memory card system. In this case, the memory controller 500 is configured to communicate with an external (e.g., a host) via one of various interface protocols such as a universal series bus (USB), a multi-media card (MMC), peripheral component interface (PCI)-E, advanced technology attachment (ATA), serial-ATA, parallel-ATA, a small computer system interface (SCSI), an enhanced small disk interface (ESDI), and integrated drive electronics. The non-volatile memory 400 may include a discharge circuit 450. The non-volatile memory 400 may be used as a data storage and a code storage for storing contents that need to remain regardless of power supply. The non-volatile memory 400 may be used for mobile devices (e.g., a cellular phone, a personal digital assistant (PDA), a digital camera, a portable game console, and an MP3 player) and home applications such as HDTV, DVD, a router, and GPS.

Figure 7:
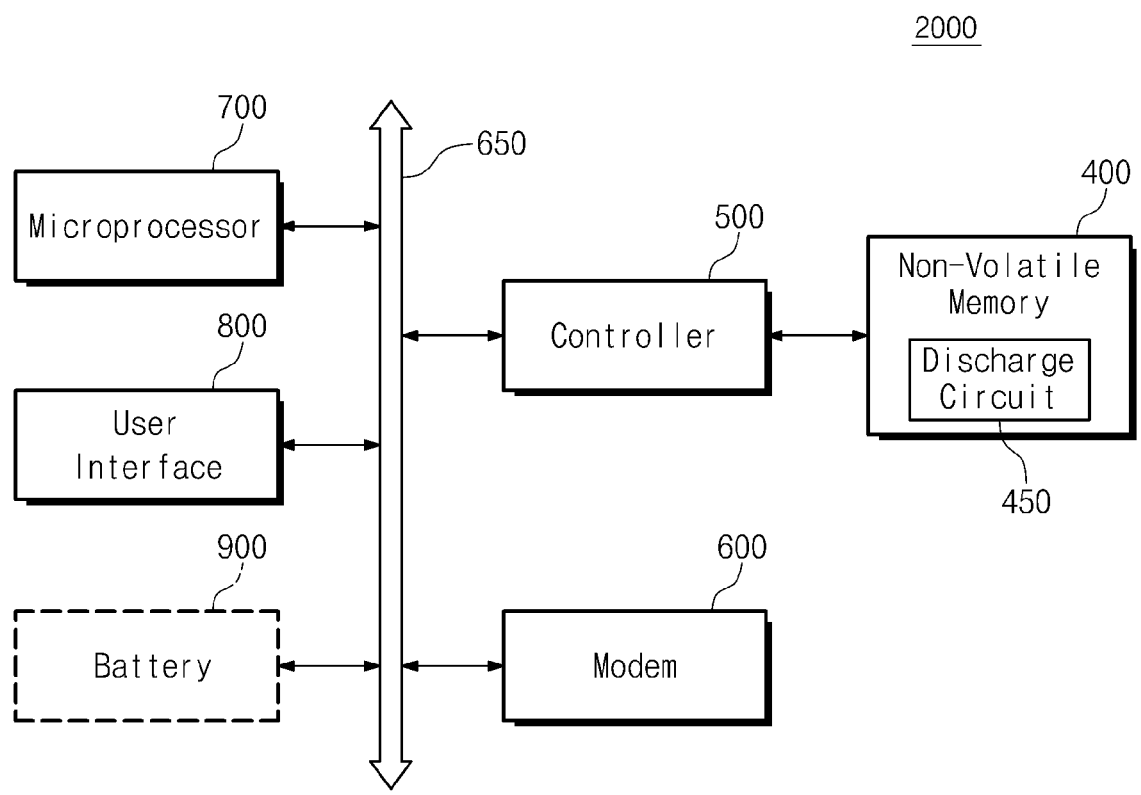
FIG. 7 is a block diagram illustrating a computing system including a non-volatile memory with a discharge circuit according to an embodiment of the present invention.

FIG. 7 is a view illustrating a schematic structure of a computing system 2000 including a non-volatile memory 400 with a discharge circuit according to an embodiment of the present invention.

Referring to FIG. 7, the computing system 2000 includes the non-volatile memory 400, a memory controller 500, a modem 600 such as a baseband chipset, a microprocessor 700, and a user interface 800, which are electrically connected through a bus 650. The discharge circuit 450 of the non-volatile memory 400 may have the same structure as one of FIGS. 1 through 4. N-bit data (N is an integer equal to or greater than 1), processed or will be processed by the microprocessor 700, are stored in the non-volatile memory 400 through the memory controller 500.

If the computing system according to the present invention is a mobile device, a battery 900 is additionally provided in order to supply an operating voltage of the computing system. Although not illustrated in FIG. 7, it is apparent to those skilled in the art that an application chipset, a camera image processor (CIS), a mobile DRAM may be further provided to the computing system 2000 according to the present invention. For example, the memory controller 500 and the non-volatile memory 400 may constitute a solid state drive/disk (SSD) that uses the non-volatile memory 400 to store data.

The non-volatile memory 400 and/or the memory controller 500 according to the present invention may be packaged using various types of packages. Examples of the packages include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc. According to exemplary embodiments of the present invention, memory cells are realized using one of various cell structures having a charge storage layer. it is apparent to those skilled in the art that the cell structure having a charge storage layer may be applied to a charge trap flash structure using a charge trap layer, a stack flash structure where arrays are stacked in a multi-layer, a flash structure without source-drain, and a pin-type flash structure.

According to a discharge circuit of the present invention, a constant current flows from a supply voltage to a negative high voltage node of a non-volatile memory and a constant current identical to the above constant current flows from a positive high voltage node of the non-volatile memory to a ground voltage at the same time. Simultaneously, the positive and negative high voltage nodes are discharged. Consequently, coupling noise is prevented in order not to exceed a withstanding voltage which can damage a transistor of a decoder circuit.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A discharge circuit for discharging two positive and negative high voltages after an erase operation of a non-volatile memory, the discharge circuit comprising:
   a negative high voltage side discharge unit flowing constant current from a supply voltage to a negative high voltage node of the non-volatile memory to discharge the negative high voltage node; and
   a positive high voltage side discharge unit flowing constant current from a positive high voltage node of the non-volatile memory to a ground voltage to discharge the positive high voltage node, the positive high voltage side discharge unit simultaneously operating with the negative high voltage side discharge unit,
   wherein values of the constant currents flowing from the positive and negative high voltage side discharge units are approximately equal.

2. The discharge circuit of claim 1, further comprising:
   a negative high voltage side potential detector detecting that the negative high voltage node is discharged into a ground voltage;
   a ground voltage fixing unit connecting the negative high voltage node to the ground voltage when it is detected by the negative high voltage side potential detector that the negative high voltage node is discharged into the ground voltage;
   a positive high voltage side potential detector detecting that the positive high voltage node is discharged into a supply voltage; and
   a supply voltage fixing unit connecting the positive high voltage node to the supply voltage when the positive high voltage side potential detector detects that the positive high voltage node is discharged into the supply voltage.

3. The discharge circuit of claim 2, wherein:
   by a gate ground type amp including a PMOS transistor and an NMOS transistor connected in series, the negative high voltage side discharge unit serves as the negative high voltage side potential detector, the PMOS transistor flowing constant current, the NMOS transistor having a gate to which a reference voltage is supplied; and
   by a gate ground type amp including an NMOS transistor and a PMOS transistor connected in series, the positive high voltage side discharge unit serves as the positive high voltage side potential detector, the NMOS transistor flowing constant current, the PMOS transistor having a gate to which a reference voltage is supplied.

4. The discharge circuit of claim 1, wherein the negative high voltage side discharge unit and the positive high voltage side discharge unit simultaneously operate by receiving a discharge start signal when two positive and negative high voltages for the negative and positive high voltage nodes are reset after the erase operation of the non-volatile memory.

5. The discharge circuit of claim 1, wherein the positive and negative high voltage side discharge units reflect constant current generated in a constant current generator and drains reflected constant current that is M times of the constant current flowing in the constant current generator.

6. The discharge circuit of claim 2, wherein the positive and negative high voltage side discharge units reflect constant current generated in a constant current generator and drains reflected constant current that is M times of the constant current flowing in the constant current generator.

7. The discharge circuit of claim 3, wherein the positive and negative high voltage side discharge units reflect constant current generated in a constant current generator and drains reflected constant current that is M times of the constant current flowing in the constant current generator.

8. The discharge circuit of claim 4, wherein the positive and negative high voltage side discharge units reflect constant current generated in a constant current generator and drains reflected constant current that is M times of the constant current flowing in the constant current generator.

9. A non-volatile memory device comprising the discharge circuit of claim 1.

10. A memory system comprising:
    the non-volatile memory device of claim 9; and
    a memory controller controlling the non-volatile memory device.

11. A computing system comprising:
    a host;
    the non-volatile memory device of claim 9; and
    a memory controller controlling the non-volatile memory device in response to a request of the host.

* * * * *